(12) United States Patent
Lai et al.

(10) Patent No.: US 12,160,968 B2
(45) Date of Patent: Dec. 3, 2024

(54) REMOTE RELEASING MODULE AND CIRCUIT BOARD DEVICE

(71) Applicant: GIGA-BYTE TECHNOLOGY CO., LTD., New Taipei (TW)

(72) Inventors: Chih-Ming Lai, New Taipei (TW); Yung-Shun Kao, New Taipei (TW)

(73) Assignee: GIGA-BYTE TECHNOLOGY CO.,LTD., New Taipei (TW)

( * ) Notice: Subject to any disclaimer, the term of this patent is extended or adjusted under 35 U.S.C. 154(b) by 190 days.

(21) Appl. No.: 17/985,096

(22) Filed: Nov. 10, 2022

(65) Prior Publication Data

US 2023/0180418 A1 Jun. 8, 2023

(30) Foreign Application Priority Data

Dec. 8, 2021 (TW) ................................. 110145767
Sep. 30, 2022 (TW) ................................. 111137168

(51) Int. Cl.
*H05K 7/14* (2006.01)

(52) U.S. Cl.
CPC .................................. *H05K 7/1417* (2013.01)

(58) Field of Classification Search
CPC .................................................... H05K 7/1417
USPC ........................................ 361/759, 801, 803
See application file for complete search history.

(56) References Cited

U.S. PATENT DOCUMENTS

| | | | |
|---|---|---|---|
| 5,815,377 A | 9/1998 | Lund et al. | |
| 6,406,309 B1 | 6/2002 | Ennis et al. | |
| 8,422,216 B2 | 4/2013 | Liang et al. | |
| 10,952,355 B1* | 3/2021 | Hocker | H05K 5/0247 |
| 2008/0183933 A1 | 7/2008 | Peng et al. | |
| 2008/0259582 A1 | 10/2008 | Cheng et al. | |
| 2009/0244856 A1* | 10/2009 | Pirillis | H05K 7/1412 |
| | | | 361/747 |
| 2012/0237177 A1* | 9/2012 | Minota | G02B 6/4284 |
| | | | 385/134 |

(Continued)

FOREIGN PATENT DOCUMENTS

| | | |
|---|---|---|
| CN | 108352660 | 7/2018 |
| EP | 2793245 | 10/2014 |

(Continued)

OTHER PUBLICATIONS

"Office Action of Taiwan Counterpart Application", issued on Jun. 6, 2023, p. 1-p. 6.

(Continued)

*Primary Examiner* — Hung S. Bui
(74) *Attorney, Agent, or Firm* — JCIPRNET (57) ABSTRACT

A remote releasing module includes a bracket, a toggle button, and a moving member. The bracket includes a first end portion and a second end portion away from each other. The toggle button is pivotally connected to the first end portion of the bracket and includes a first driving portion. The moving member is movably disposed on the bracket and extends from a position close to the first end portion to the second end portion. The moving member includes a second driving portion disposed on the first driving portion so as to drive the toggle button to move. A circuit board device including a circuit board body, a connector slot, and the remote releasing module is also provided. The connector slot is disposed on the circuit board body.

8 Claims, 11 Drawing Sheets

(56) References Cited

U.S. PATENT DOCUMENTS

| | | | |
|---|---|---|---|
| 2013/0322832 A1* | 12/2013 | Wang | G02B 6/4261 |
| | | | 385/92 |
| 2016/0109910 A1* | 4/2016 | Fan | G06F 1/185 |
| | | | 248/286.1 |
| 2018/0090862 A1 | 3/2018 | Li et al. | |
| 2020/0310500 A1 | 10/2020 | Mao et al. | |
| 2021/0352818 A1 | 11/2021 | Chang et al. | |
| 2023/0396022 A1* | 12/2023 | Chen | H01R 13/635 |

FOREIGN PATENT DOCUMENTS

| | | |
|---|---|---|
| TW | M251200 | 11/2004 |
| TW | 201108513 | 3/2011 |
| TW | M438551 | 10/2012 |
| TW | M518839 | 3/2016 |
| TW | M595343 | 5/2020 |
| TW | M610315 | 4/2021 |

OTHER PUBLICATIONS

"Search Report of Europe Counterpart Application", issued on Jul. 17, 2023, p. 1-p. 10.
"Search Report of Europe Counterpart Application, Application No. 22189675.6", issued on Apr. 13, 2023, p. 1-p. 9.
"Office Action of Related U.S. Appl. No. 17/694,720", issued on Sep. 13, 2023, p. 1-p. 19.

* cited by examiner

REMOTE RELEASING MODULE AND CIRCUIT BOARD DEVICE

CROSS-REFERENCE TO RELATED APPLICATION

This application claims the priority benefits of Taiwanese application no. 110145767, filed on Dec. 8, 2021 and Taiwanese application no. 111137168, filed on Sep. 30, 2022. The entirety of each of the above-mentioned patent applications is hereby incorporated by reference herein and made a part of this specification.

BACKGROUND

Technical Field

The disclosure relates to a releasing module and a device including the releasing module. Particularly, the disclosure relates to a remote releasing module and a circuit board device including the remote releasing module.

Description of Related Art

A toggle button of a PCI-E connector is located at the end of the connector. An expansion card inserted in the PCI-E connector can be jacked up by pressing the toggle button. In response to an increasing size of electronic components that causes inconvenience for users to press the toggle button, the toggle button of the current PCI-E connector may be activated through a remote assembly. For example, the remote assembly includes a corresponding structure connected to the toggle button of the PCI-E connector. The expansion card in the PCI-E connector can be jacked up by pressing a push button of the remote assembly to drive the structure to rotate the toggle button.

However, assembling the remote assembly to a circuit board requires multiple procedures; it is required to fix the remote assembly to the circuit board, hook the structure for rotating the toggle button to the toggle button on the connector, and particularly attend to alignment between the remote assembly and the toggle button of the connector. How to simplify the assembly procedures and improve the assembly efficiency is a research direction in the related fields.

SUMMARY

The disclosure provides a remote releasing module, which includes a toggle button and a moving member for driving the toggle button. When the remote releasing module is mounted on a circuit board body, it is not required to consider assembly alignment between the toggle button and the moving member.

The disclosure provides a circuit board device including the remote releasing module.

According to an embodiment of the disclosure, a remote releasing module includes a bracket, a toggle button, and a moving member. The bracket includes a first end portion and a second end portion away from each other. The toggle button is pivotally connected to the first end portion of the bracket and includes a first driving portion. The moving member is movably disposed on the bracket and extends from a position close to the first end portion to the second end portion. The moving member includes a second driving portion disposed on the first driving portion so as to drive the toggle button to move.

According to an embodiment of the disclosure, a circuit board device includes a circuit board body, a connector slot, and a remote releasing module. The connector slot is disposed on the circuit board body. The remote releasing module is disposed on the circuit board body and includes a bracket, a toggle button, and a moving member. The bracket includes a first end portion and a second end portion away from each other. The toggle button is pivotally connected to the first end portion of the bracket and located beside the connector slot. The toggle button includes a first driving portion. The moving member is movably disposed on the bracket and extends from a position close to the first end portion to the second end portion. The moving member includes a second driving portion disposed on the first driving portion so as to drive the toggle button to move.

In an embodiment of the disclosure, the remote releasing module further includes a push button. The push button is pressably disposed on the second end portion of the bracket and linked with the moving member. When the push button is pressed, the moving member is driven and the toggle button is pulled to be rotated relative to the bracket.

In an embodiment of the disclosure, the toggle button includes a main body, an extension portion, and a pivot. The extension portion extends from the main body to a bottom wall of the bracket. The pivot protrudes from the extension portion. The pivot includes a pivot end surface away from the extension portion. The pivot end surface is at least partially inclined toward the bottom wall.

In an embodiment of the disclosure, the first end portion includes a top wall, a groove, and two position retaining surfaces. The groove is recessed from the top wall. The two position retaining surfaces define the groove. The extension portion extends into the groove and between the two position retaining surfaces.

In an embodiment of the disclosure, the first driving portion includes a boss protruding from the main body. The second driving portion includes a hole sleeved on the boss. The boss includes a boss end surface away from the main body. The boss end surface is at least partially inclined.

Based on the foregoing, in the embodiments of the disclosure, the connector slot of the circuit board device is disposed on the circuit board body, and the remote releasing module is disposed on the circuit board body and located beside the connector slot. The toggle button of the remote releasing module is pivotally connected to the first end portion of the bracket and includes the first driving portion. The moving member is movably disposed on the bracket and extends from a position close to the first end portion of the bracket to the second end portion of the bracket. The moving member includes the second driving portion linked with the first driving portion of the toggle button so as to drive the toggle button to move. In the circuit board device of the embodiments of the disclosure, the remote releasing module is disposed on the circuit board body, and the toggle button is located beside the connector slot, which can jack up the expansion card to be subsequently inserted into the connector slot. Since the remote releasing module includes the toggle button and the moving member for driving the toggle button, the assembly alignment between the toggle button and the moving member has been completed during the assembly stage of the remote releasing module. Such alignment is not required to be performed on the circuit board body, simplifying the assembly procedures on the circuit board body. In addition, the requirements for alignment precision between the toggle button and the connector slot is relatively low; the remote releasing module can be disposed at a specific position on the circuit board body, facilitating the assembly.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
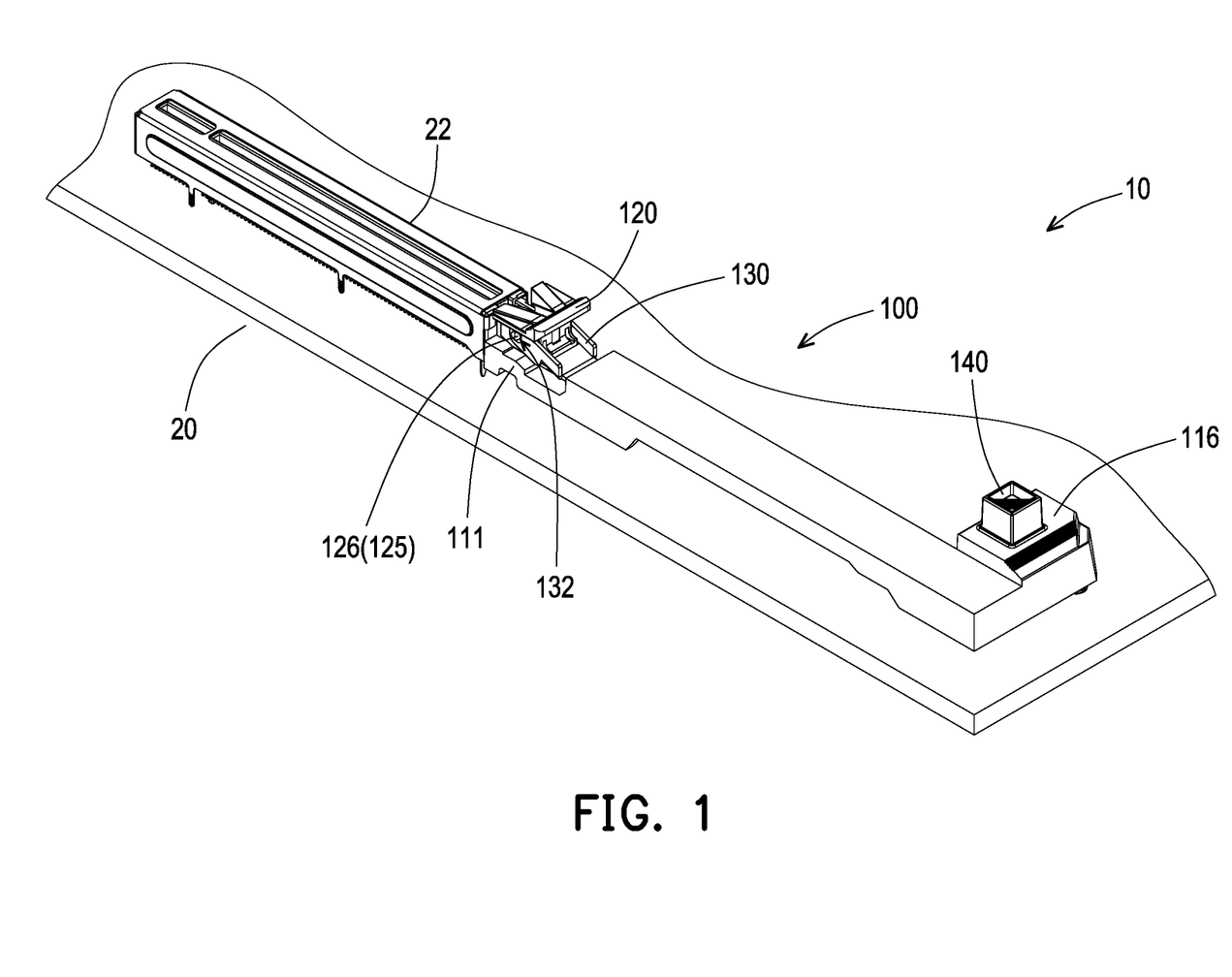
FIG. 1 is a schematic partial view of a circuit board device according to an embodiment of the disclosure.

FIG. 1 is a schematic partial view of a circuit board device according to an embodiment of the disclosure. With reference to FIG. 1, in this embodiment, a circuit board device 10 includes a circuit board body 20, a connector slot 22, and a remote releasing module 100. The circuit board body 20 is a motherboard, for example. The connector slot 22 is disposed on the circuit board body 20. The connector slot 22 is a PCI-E connector slot, for example, but the type of the connector slot 22 is not limited thereto. The connector slot 22 is adapted for inserting an expansion card 30 (FIG. 7) such as a display card (not shown), but the type of the expansion card 30 is not limited thereto.

In this embodiment, the remote releasing module 100 is disposed on the circuit board body 20 and located beside the connector slot 22. Since the current display card (the expansion card 30) is typically equipped with large-sized heat dissipation fins and fans, it is inconvenient for the user to touch a toggle button 120 for jacking the expansion card 30. In the circuit board device 10 of this embodiment, removal of the display card (the expansion card 30) may be facilitated through the remote releasing module 100. The specific structure of the remote releasing module 100 is described below.

Figure 2:
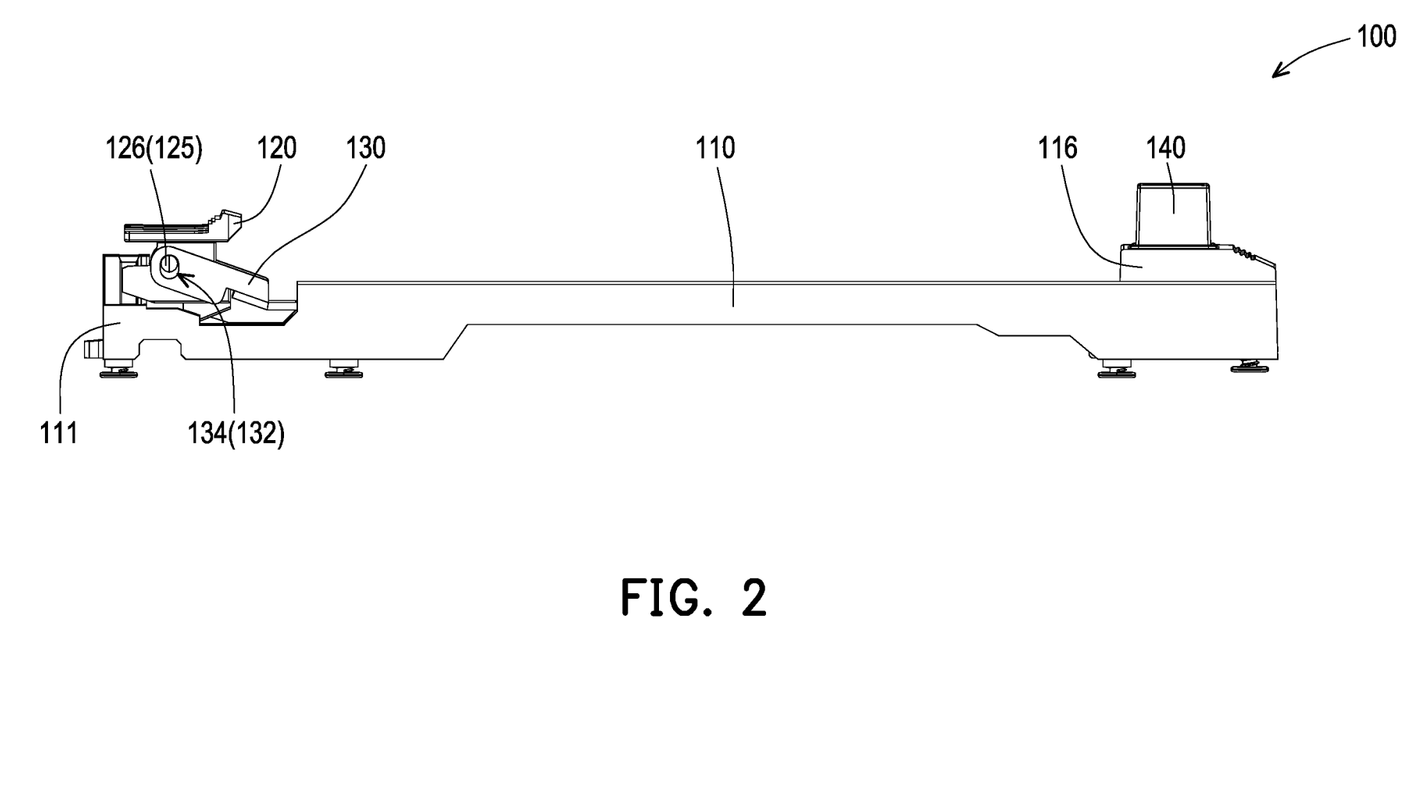
FIG. 2 is a schematic side view of the remote releasing module of the circuit board device of FIG. 1.

FIG. 2 is a schematic side view of the remote releasing module of the circuit board device of FIG. 1. With reference to FIG. 2, in this embodiment, the remote releasing module 100 includes a bracket 110, a toggle button 120, and a moving member 130.

The bracket 110 includes a first end portion 111 and a second end portion 116 away from each other. As can be seen from FIG. 1, the bracket 110 has an L shape, for example. The first end portion 111 and the second end portion 116 are two end portions of the L shape, for example. Nonetheless, the shape of the bracket 110 and the positions of the first end portion 111 and the second end portion 116 are not limited thereto.

The toggle button 120 is pivotally connected to the first end portion 111 of the bracket 110. As shown in FIG. 1, the toggle button 120 is located beside the connector slot 22 to limit the expansion card 30 from moving up or to jack the expansion card 30. The toggle button 120 includes a first driving portion 125. The moving member 130 is movably disposed on the bracket 110. The moving member 130 includes a second driving portion 132 disposed on the first driving portion 125 so as to drive the toggle button 120 to move, accordingly jacking the expansion card 30. In this embodiment, the first driving portion 125 includes a boss 126 protruding from a main body 121, and the second driving portion 132 includes a hole 134 sleeved on the boss 126. The types of the first driving portion 125 and the second driving portion 132 are not limited thereto.

In the conventional circuit board device, the toggle button is pivotally connected to the connector slot instead of the bracket. Therefore, the remote assembly for driving the toggle button is required to be disposed on the circuit board body. In addition, the driving structure of the remote assembly is also required to be assembled and aligned with the toggle button pivotally connected to the pivoting connector slot. The assembly is relatively inconvenient. Compared with the conventional circuit board device, in this embodiment, the toggle button 120 is instead disposed on the bracket 110. In other words, the remote releasing module 100 includes the toggle button 120, so that it is not required to consider the assembly alignment between the toggle button 120 and the driving structure (the moving member 130) when the remote releasing module 100 is mounted on the circuit board body 20. Therefore, it is relatively simple and convenient to mount the remote releasing module 100 on the circuit board body 20.

The detailed structure between the toggle button 120 and the bracket 110 is further described below.

Figure 3:
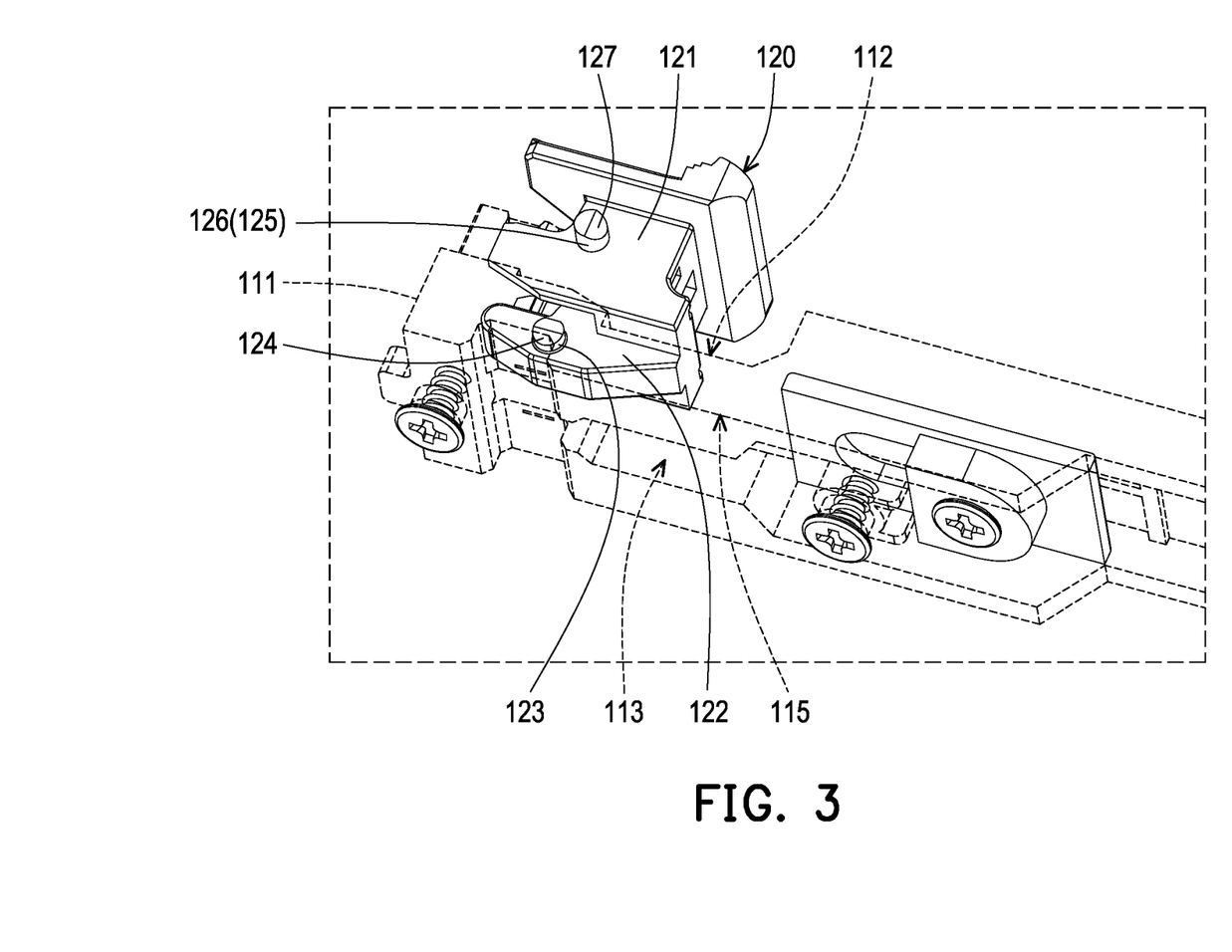
FIG. 3 is a schematic partial perspective view of the bracket and the toggle button of the remote releasing module of FIG. 2.

FIG. 3 is a schematic partial perspective view of the bracket and the toggle button of the remote releasing module of FIG. 2. In FIG. 3, the moving member 130 is omitted, and the bracket 110 is illustrated with broken lines to clearly show the shape of the toggle button 120. With reference to FIG. 3, in this embodiment, the toggle button 120 includes a main body 121, an extension portion 122, and a pivot 123. The extension portion 122 extends from the main body 121 to a bottom wall 115 of the bracket 110. The pivot 123 protrudes from the extension portion 122.

The first end portion 111 of the bracket 110 includes a top wall 112, a bottom wall 115, and a groove 113. The groove 113 is recessed from the top wall 112 and the bottom wall 115, and penetrates the top wall 112 and the bottom wall 115. The extension portion 122 extends into the groove 113.

The toggle button 120 is pivotally connected to the bracket 110 through the pivot 123, and may be rotated relative to the bracket 110. The pivot 123 includes a pivot end surface 124 away from the extension portion 122. The pivot end surface 124 is at least partially inclined toward the bottom wall 115 of the first end portion 111. Specifically, the lower part of the pivot end surface 124 is inclined so that the height of the pivot 123 protruding from the extension portion 122 is minimal at the lowermost end.

In this embodiment, when the toggle button 120 is assembled to the bracket 110, the toggle button 120 may be placed from the top wall 112 of the first end portion 111 downward into the groove 113. By designing the pivot end surface 124 to be at least partially inclined toward the bottom wall 115, when the toggle button 120 is assembled to the bracket 110, the extension portion 122 can be smoothly placed downward into the corresponding pivot hole (not shown) in the first end portion 111. In other embodiments, the pivot end surface 124 of the toggle button 120 may also be a surface entirely inclined downward to facilitate the assembly. In other embodiments, the pivot end surface 124 of the toggle button 120 may also be flat.

In addition, the boss 126 includes a boss end surface 127 away from the main body 121. The boss end surface 127 is at least partially inclined. In this embodiment, the boss end surface 127 in the right part of FIG. 3 is a surface inclined toward the right side. This design facilitates sleeving the second driving portion 132 (in FIG. 2; i.e., the hole 134) of the moving member 130 on the first driving portion 125 (i.e., the boss 126), which facilitates the assembly.

Figure 4:
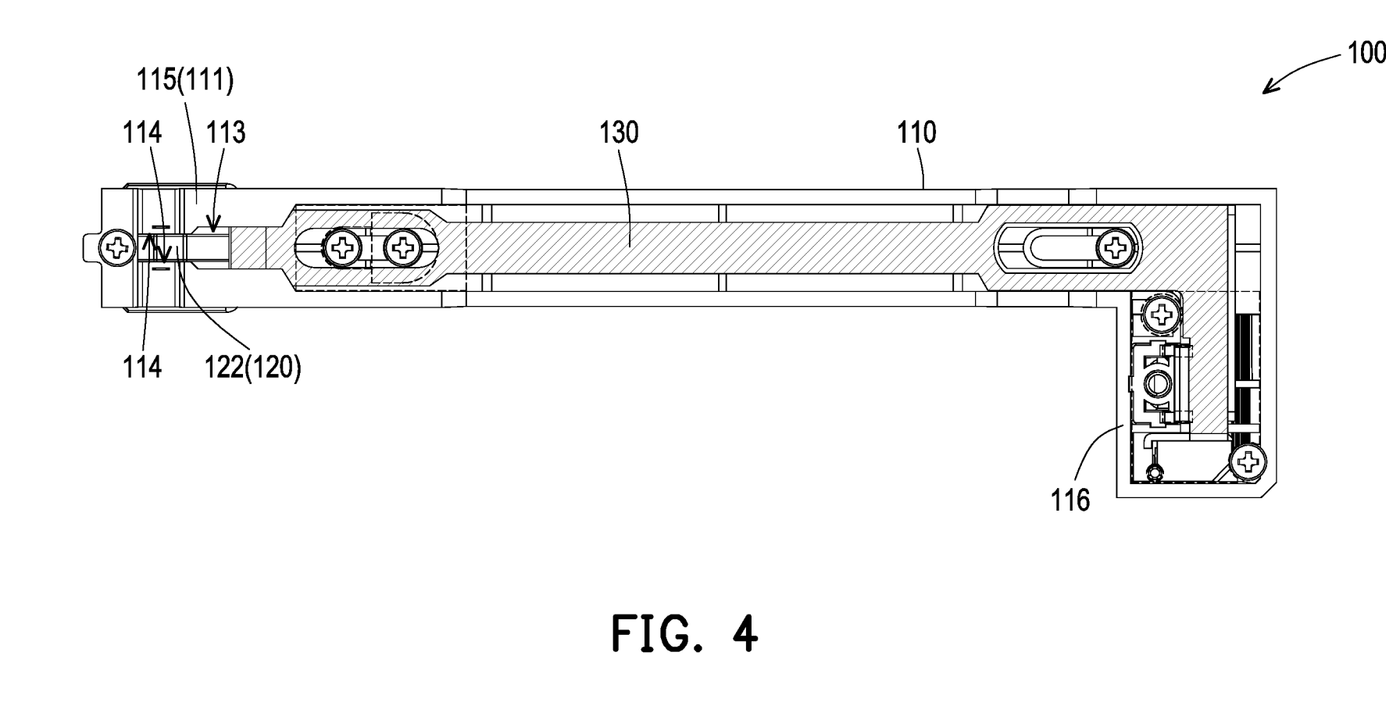
FIG. 4 is a schematic bottom view of FIG. 2.

FIG. 4 is a schematic bottom view of FIG. 2. To clearly show the extension area of the moving member 130, the bottom plate below the bracket 110 for limiting the moving member 130 from moving downward is hidden in FIG. 4. With reference to FIG. 4, in this embodiment, the moving member 130 extends from a position close to the first end portion 111 to the second end portion 116. Since the bracket 110 has an L shape, the moving member 130 also has an L shape.

Figure 5:
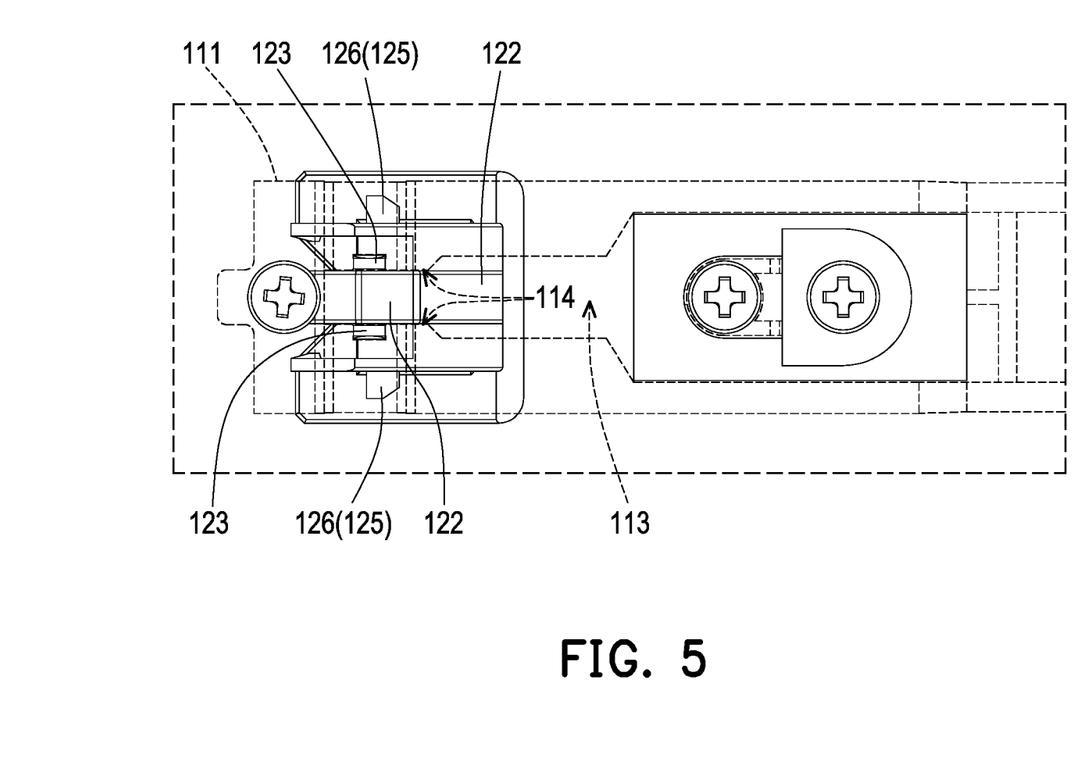
FIG. 5 is a schematic partial perspective bottom view of the bracket and the toggle button of the remote releasing module of FIG. 2.

FIG. 5 is a schematic partial perspective bottom view of the bracket and the toggle button of the remote releasing module of FIG. 2. In FIG. 5, the moving member 130 is omitted, and the bracket 110 is illustrated with broken lines to clearly show the relative positions of the toggle button 120 and the first end portion 111.

With reference to FIG. 5, in this embodiment, the first end portion 111 includes two position retaining surfaces 114 that define the groove 113. The extension portion 122 is located between the two position retaining surfaces 114. The two pivots 123 protruding from the extension portion 122 are placed in the corresponding pivot holes (not shown) on the two position retaining surfaces 114. The distance between the two position retaining surfaces 114 is slightly greater than the width of the extension portion 122 to prevent the two position retaining surfaces 114 from hindering the rotation of the extension portion 122 relative to the bracket 110. Meanwhile, the distance between the two position retaining surfaces 114 is not excessively great to prevent the extension portion 122 from moving relative to the bracket 110 along the extending direction of the pivot 123 (the vertical direction of FIG. 5), reducing the likelihood that the extension portion 122 is shaken relative to the bracket 110 or falls off. Therefore, the extension portion 122 can stably rotate relative to the bracket 110.

Figure 6:
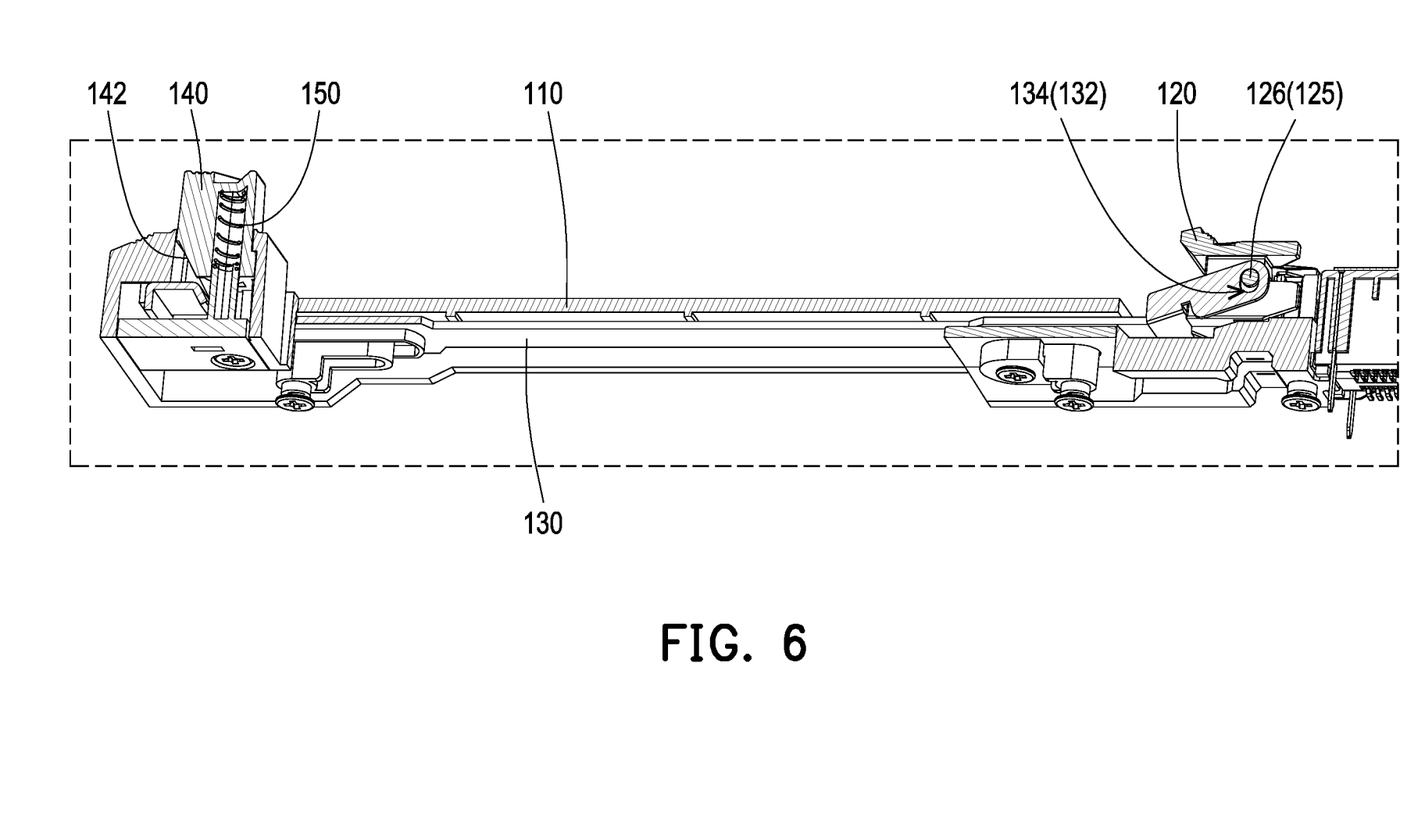
FIG. 6 is a schematic partial cross-sectional view with the circuit board body in FIG. 1 being hidden.

FIG. 6 is a schematic partial cross-sectional view with the circuit board body in FIG. 1 being hidden. With reference to FIG. 6, in this embodiment, the remote releasing module 100 may optionally include a push button 140. The push button 140 is pressably disposed on the second end portion 116 (FIG. 1) of the bracket 110 and linked with the moving member 130. In this embodiment, the moving member 130 extends below the push button 140. When the push button is pressed, the push button 140 pushes the moving member 130 downward and drives the moving member 130 to move in a direction away from the connector slot 22. Accordingly, the toggle button 120 is pulled to be rotated relative to the bracket 110.

With reference back to FIG. 1, in this embodiment, the push button 140 is disposed on the circuit board body 20 and away from the connector slot 22. Since relatively few large-sized elements are disposed on the edge of the circuit board body 20, by disposing the push button 140 on the edge of the circuit board body 20, it is possible to prevent the push button 140 from being blocked by other elements.

The position for disposing the push button 140 is not limited thereto. The push button 140 may be disposed as long as it is not blocked by other elements. In other embodiments, it is also possible that the remote releasing module 100 does not include the push button 140, and the user may directly grasp the moving member 130 to rotate the toggle button 120.

Figure 7:
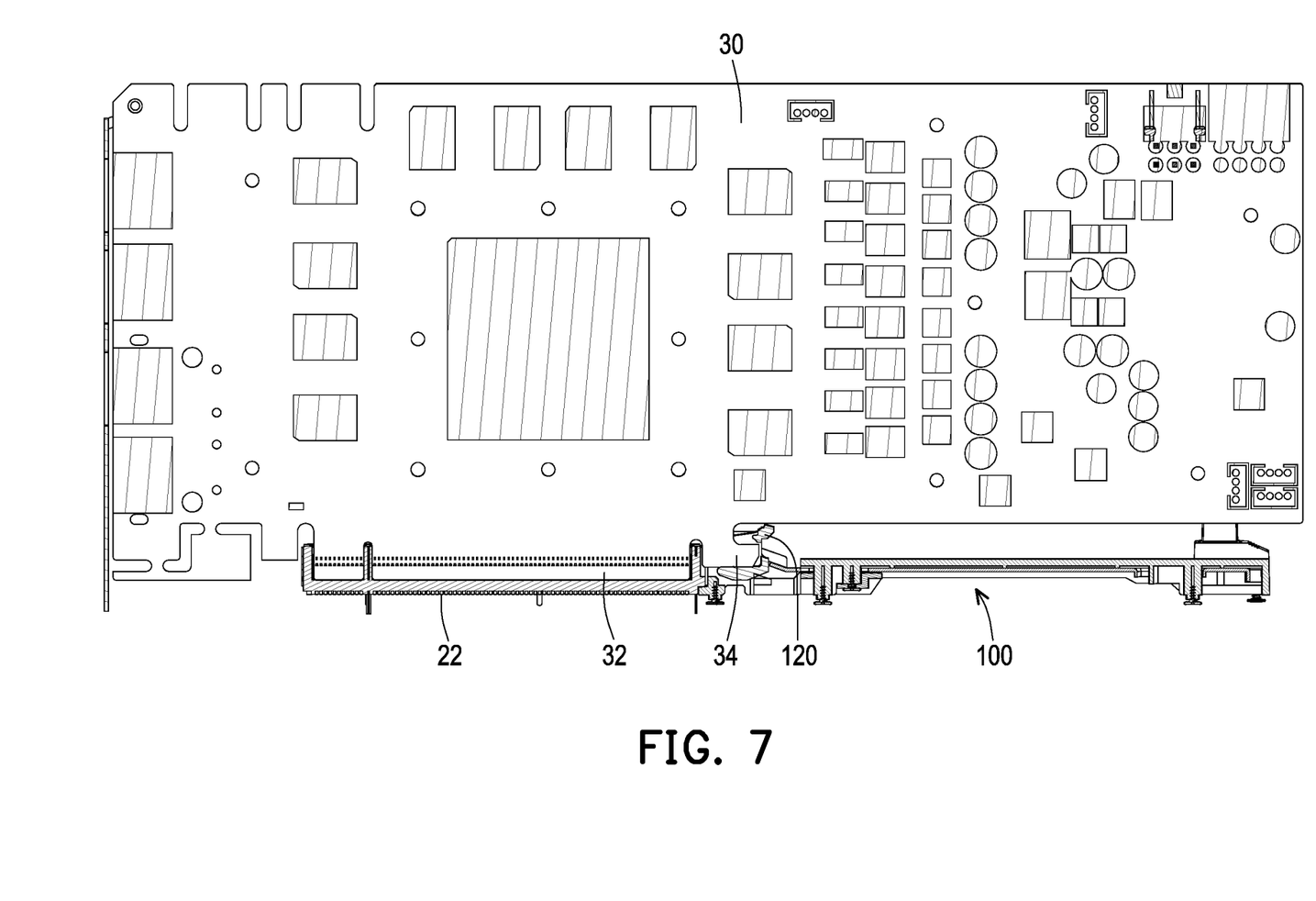
FIG. 7 is a schematic cross-sectional view with the circuit board body in FIG. 1 being hidden and an expansion card being inserted into the connector slot.
Figure 8:
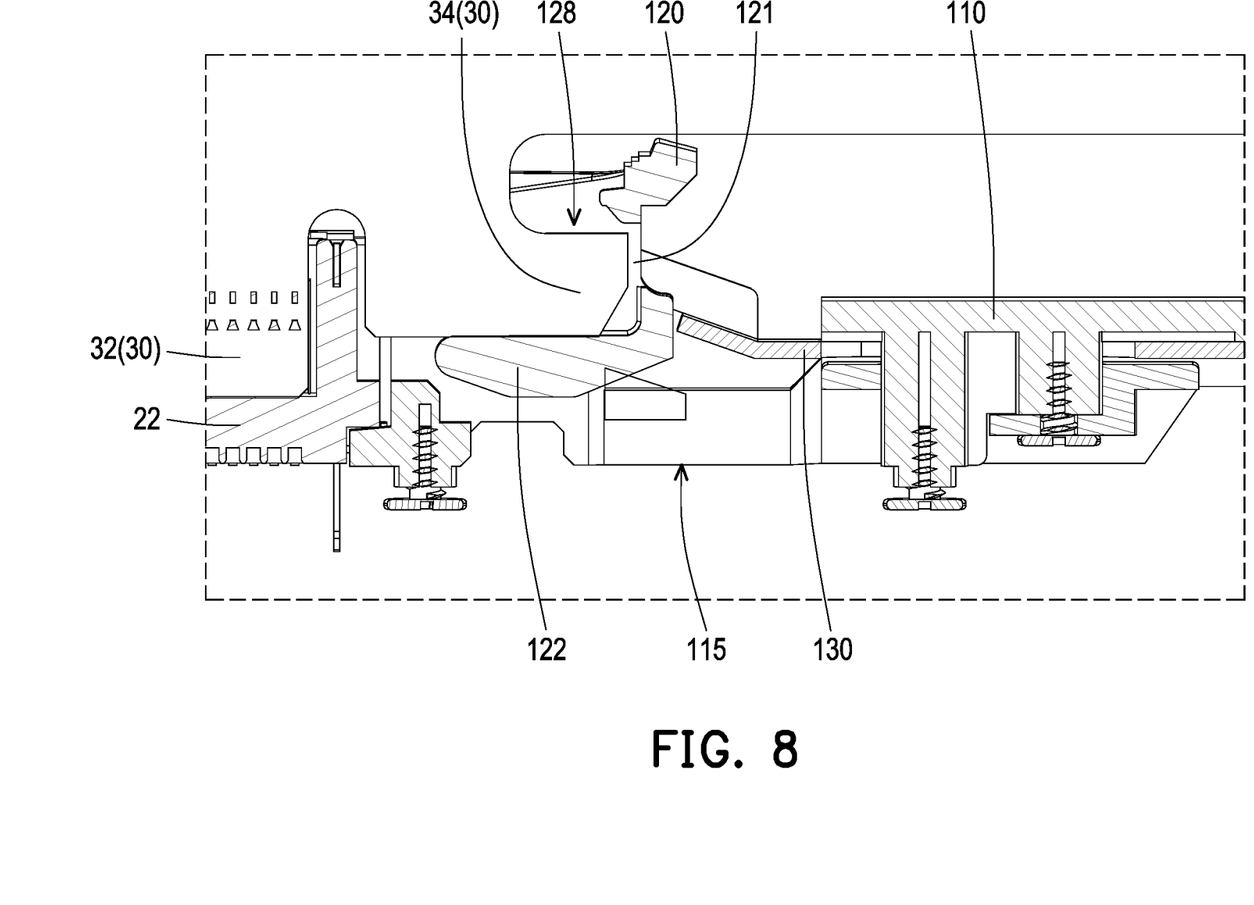
FIG. 8 is a schematic partially enlarged view of FIG. 7.

FIG. 7 is a schematic cross-sectional view with the circuit board body in FIG. 1 being hidden and an expansion card being inserted into the connector slot. FIG. 8 is a schematic partially enlarged view of FIG. 7. With reference to FIG. 7 and FIG. 8, in this embodiment, the expansion card 30 includes a connection port 32 and a fixing port 34. The connection port 32 is plugged into the connector slot 22 to be electrically connected to the circuit board body 20. The fixing port 34 may be placed into an accommodating groove 128 (in FIG. 8) of the toggle button 120 and is supported by the extension portion 122 (FIG. 8).

Figure 9:
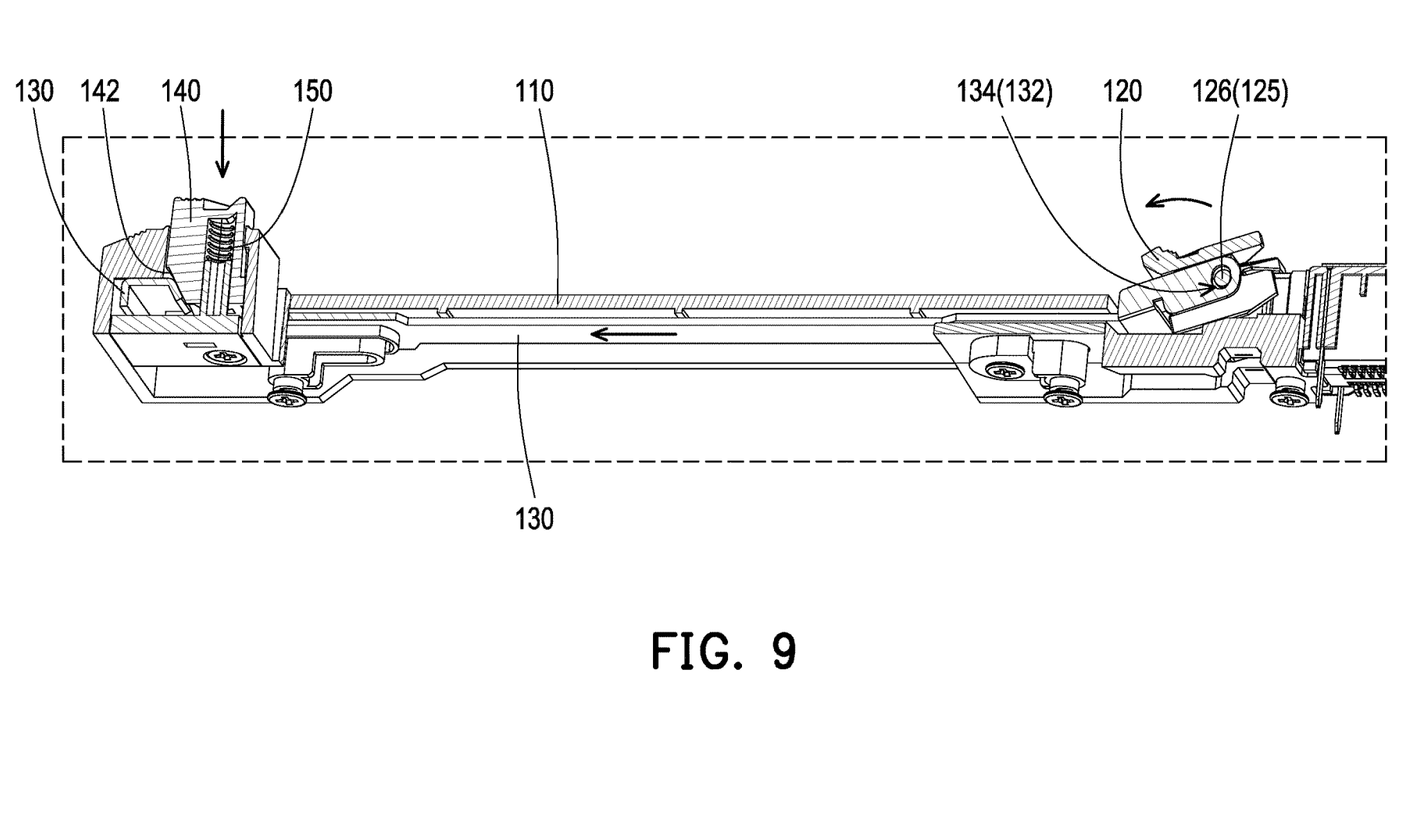
FIG. 9 is a schematic cross-sectional view showing a push button being pressed.

FIG. 9 is a schematic cross-sectional view showing a push button being pressed. With reference to FIG. 9, when the expansion card 30 is to be jacked, by pressing the push button 140, the inclined surface 142 at the bottom of the push button 140 pushes the moving member 130 to move in a direction away from the connector slot 22 (i.e., to move toward the left part of FIG. 9), the second driving portion 132 of the moving member 130 drives the first driving portion 125 of the toggle button 120, and the toggle button 120 rotates relative to the bracket 110.

Figure 10:
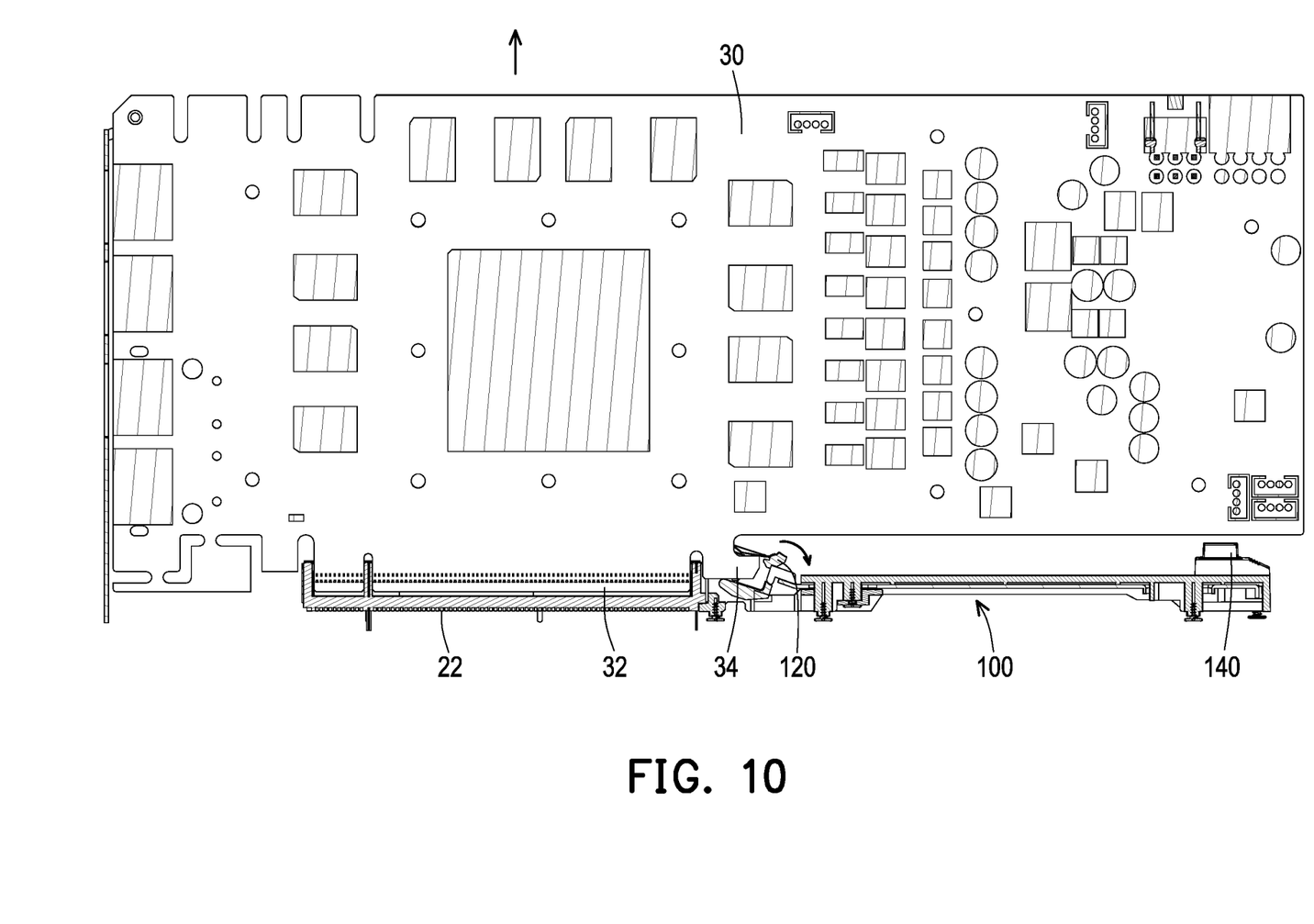
FIG. 10 is a schematic cross-sectional view showing a push button being pressed and a toggle button jacking an expansion card.
Figure 11:
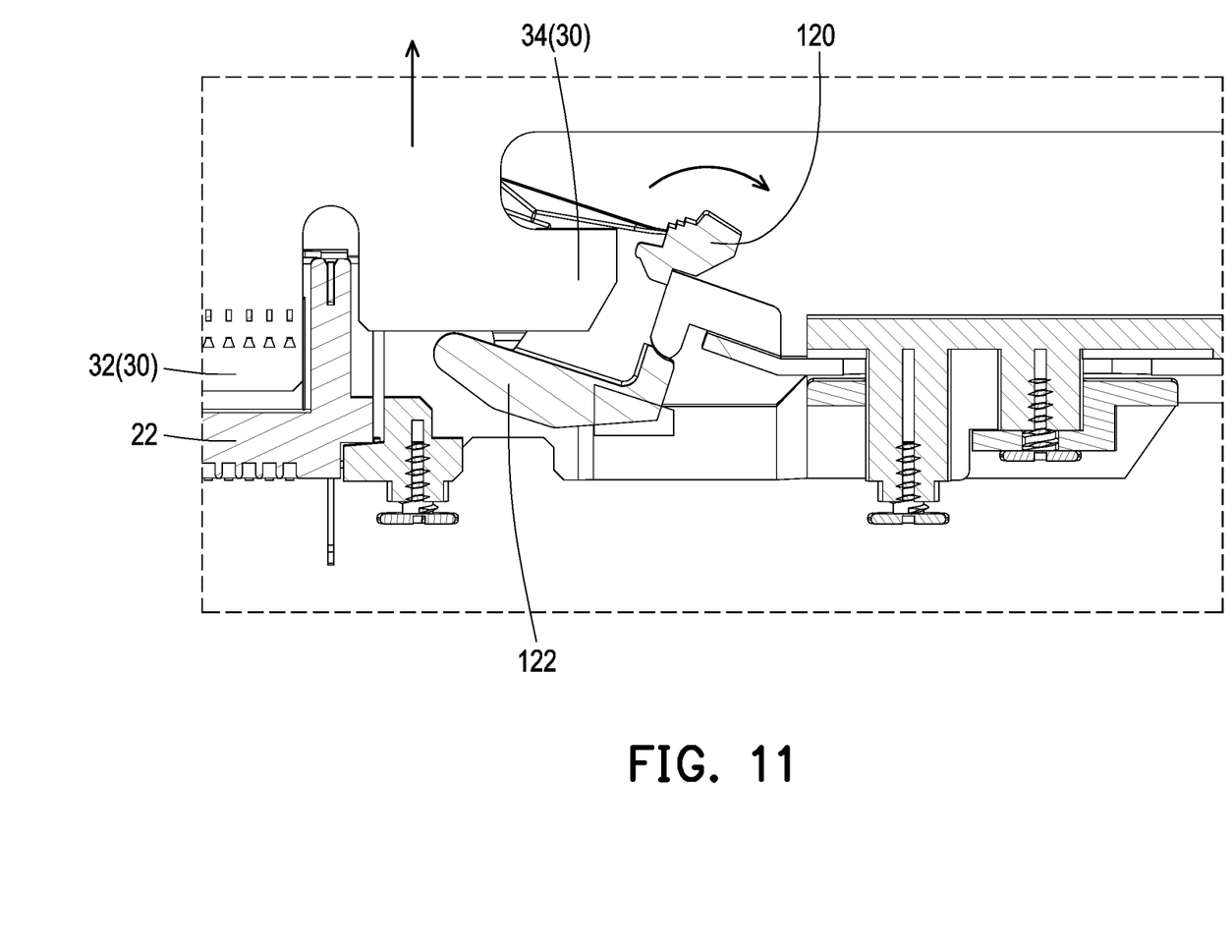
FIG. 11 is a schematic partially enlarged view of FIG. 10.

FIG. 10 is a schematic cross-sectional view showing a push button being pressed and a toggle button jacking an expansion card. FIG. 11 is a schematic partially enlarged view of FIG. 10. With reference to FIG. 10 and FIG. 11, when the toggle button 120 rotates relative to the bracket 110, the extension portion 122 of the toggle button 120 jacks the fixing port 34 of the expansion card 30, so the expansion card 30 moves up.

Subsequently, when the push button 140 is released, an elastic member 150 causes the push button 140 to rebound, and the push button 140 can be jacked up and returned to its original position. In addition, when the user inserts the connection port 32 of the expansion card 30 into the connector slot 22 again, the fixing port 34 of the expansion card 30 pushes down the extension portion 122 of the toggle button 120, so that the toggle button 120 is returned to its original position.

In this embodiment, the remote releasing module 100 includes the toggle button 120 and the moving member 130 for driving the toggle button 120. Therefore, it is not required to dispose a toggle button or other corresponding structures on the connector slot 22, and the connector slot 22 can use the standard common connector slot, reducing the cost for special specifications.

In addition, the assembly alignment between the toggle button 120 and the moving member 130 has been completed during the assembly stage of the remote releasing module 100. Such alignment is not required to be performed on the circuit board body 20. In addition, requirements for alignment precision between the toggle button 120 and the connector slot 22 is relatively low, and their arrangement can be completed by locking the remote releasing module 100 on the circuit board body 20, simplifying the assembly procedures on the circuit board body 20.

In summary of the foregoing, in the embodiments of the disclosure, the connector slot of the circuit board device is disposed on the circuit board body, and the remote releasing module is disposed on the circuit board body and located beside the connector slot. The toggle button of the remote releasing module is pivotally connected to the first end portion of the bracket and includes the first driving portion. The moving member is movably disposed on the bracket and extends from a position close to the first end portion of the bracket to the second end portion of the bracket. The moving member includes the second driving portion linked with the first driving portion of the toggle button so as to drive the toggle button to move. In the circuit board device of the embodiments of the disclosure, the remote releasing module is disposed on the circuit board body, and the toggle button is located beside the connector slot, which can jack up the expansion card to be subsequently inserted into the connector slot. Since the remote releasing module includes the toggle button and the moving member for driving the toggle button, the assembly alignment between the toggle button and the moving member has been completed during the assembly stage of the remote releasing module. Such alignment is not required to be performed on the circuit board body, simplifying the assembly procedures on the circuit board body. In addition, the requirements for alignment precision between the toggle button and the connector slot is relatively low; the remote releasing module can be disposed at a specific position on the circuit board body, facilitating the assembly.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A remote releasing module comprising:
   a bracket comprising a first end portion and a second end portion away from each other;
   a toggle button pivotally connected to the first end portion of the bracket and comprising a first driving portion, a main body, an extension portion extending from the main body to a bottom wall of the bracket and a pivot protruding from the extension portion, wherein the pivot comprises a pivot end surface away from the extension portion, and the pivot end surface is at least partially inclined toward the bottom wall; and
   a moving member movably disposed on the bracket and extending from a position close to the first end portion to the second end portion, wherein the moving member comprises a second driving portion disposed on the first driving portion so as to drive the toggle button to move.

2. The remote releasing module according to claim 1, further comprising:
   a push button pressably disposed on the second end portion of the bracket and linked with the moving member, wherein, when the push button is pressed, the moving member is driven and the toggle button is pulled to be rotated relative to the bracket.

3. The remote releasing module according to claim 1, wherein the first end portion comprises:
   a top wall;
   a groove recessed from the top wall; and
   two position retaining surfaces defining the groove, wherein the extension portion extends into the groove and between the two position retaining surfaces.

4. The remote releasing module according to claim 1, wherein the first driving portion comprises a boss protruding from the main body, the second driving portion comprises a hole sleeved on the boss, the boss comprises a boss end surface away from the main body, and the boss end surface is at least partially inclined.

5. A circuit board device comprising:
   a circuit board body;
   a connector slot disposed on the circuit board body; and
   a remote releasing module disposed on the circuit board body and comprising:
   a bracket comprising a first end portion and a second end portion away from each other;
   a toggle button pivotally connected to the first end portion of the bracket and located beside the connector slot, the toggle button comprising a first driving portion, a main body, an extension portion extending from the main body to a bottom wall of the bracket, and a pivot protruding from the extension portion, wherein the pivot comprises a pivot end surface away from the extension portion, and the pivot end surface is at least partially inclined toward the bottom wall; and
   a moving member movably disposed on the bracket and extending from a position close to the first end portion to the second end portion, wherein the moving member comprises a second driving portion disposed on the first driving portion so as to drive the toggle button to move.

6. The circuit board device according to claim 5, wherein the remote releasing module further comprises:
   a push button pressably disposed on the second end portion of the bracket and linked with the moving member, wherein, when the push button is pressed, the moving member is driven and the toggle button is pulled to be rotated relative to the bracket.

7. The circuit board device according to claim 5, wherein the first end portion comprises:
   a top wall;
   a groove recessed from the top wall; and
   two position retaining surfaces defining the groove, wherein the extension portion extends into the groove and between the two position retaining surfaces.

8. The circuit board device according to claim 5, wherein the first driving portion comprises a boss protruding from the main body, the second driving portion comprises a hole sleeved on the boss, the boss comprises a boss end surface away from the main body, and the boss end surface is at least partially inclined.

* * * * *